(12) United States Patent
Kobayashi et al.

(10) Patent No.: US 10,361,299 B2
(45) Date of Patent: Jul. 23, 2019

(54) SEMICONDUCTOR DEVICE AND METHOD OF MANUFACTURING A SEMICONDUCTOR DEVICE

(71) Applicant: FUJI ELECTRIC CO., LTD., Kawasaki-shi, Kanagawa (JP)

(72) Inventors: Yusuke Kobayashi, Tsukuba (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/042,330

(22) Filed: Jul. 23, 2018

(65) Prior Publication Data
US 2019/0074372 A1 Mar. 7, 2019

(30) Foreign Application Priority Data
Sep. 7, 2017 (JP) .................. 2017-172419

(51) Int. Cl.
*H01L 29/66* (2006.01)
*H01L 29/78* (2006.01)
(Continued)

(52) U.S. Cl.
CPC .... *H01L 29/7813* (2013.01); *H01L 21/26513* (2013.01); *H01L 29/1095* (2013.01); *H01L 29/66712* (2013.01)

(58) Field of Classification Search
USPC ....... 257/330, 163–166, 197, 205, 273, 351, 257/361, 378, 423, 427, 474, 477, 517, 257/526, 539, 544, 565–593, 928, 257/E51.004, E31.069, E27.017, 257/E27.019–E27.023, E27.037–E27.043, 257/E27.053–E27.058, E27.074–E27.078, 257/E27.106, E27.149, E29.03–E29.035, 257/E29.044–E29.045, E29.114, E29.12, 257/E29.027–E29.028, E29.066–E29.067, 257/E29.194–E29.202, E21.382–E21.385,
(Continued)

(56) References Cited

U.S. PATENT DOCUMENTS

2018/0182885 A1* 6/2018 Kobayashi .......... H01L 29/4236
2018/0233564 A1* 8/2018 Kumada .............. H01L 29/1608

FOREIGN PATENT DOCUMENTS

| JP | 2008-147232 | 6/2008 |
| JP | 2015-153893 | 8/2015 |

* cited by examiner

Primary Examiner — Niki H Nguyen

(57) ABSTRACT

In an n-type current diffusion region, a first $p^+$-type region is provided under a bottom of a trench (gate trench). Further, in the n-type current diffusion region, a second $p^+$-type region is provided between adjacent trenches so as to be separated from the first $p^+$-type region and in contact with a p-type base region. In the p-type base region, a third $p^+$-type region is provided near a side wall of the trench so as to be separated from the trench and first and second $p^+$-type regions. A depth of the third $p^+$-type region from an interface of the p-type base region and an $n^+$-type source region does not reach the n-type current diffusion region. A shortest distance from the third $p^+$-type region to the second $p^+$-type region is at most a distance between the first and second $p^+$-type regions.

8 Claims, 12 Drawing Sheets

(51) Int. Cl.
*H01L 21/265* (2006.01)
*H01L 29/10* (2006.01)
(58) Field of Classification Search
USPC .......... 257/E21.608–E21.613; 438/202–208,
438/243–239, 170, 189, 309–378
See application file for complete search history.

SEMICONDUCTOR DEVICE AND METHOD OF MANUFACTURING A SEMICONDUCTOR DEVICE

CROSS REFERENCE TO RELATED APPLICATIONS

This application is based upon and claims the benefit of priority of the prior Japanese Patent Application No. 2017-172419, filed on Sep. 7, 2017, the entire contents of which are incorporated herein by reference.

BACKGROUND

1. Field

Embodiments of the invention relate to a semiconductor device and a method of manufacturing a semiconductor device.

2. Description of the Related Art

A semiconductor material (hereinafter, wide bandgap semiconductor material) that has a bandgap wider than that of silicon has a critical field strength that is higher than that of silicon and therefore, is expected to be a semiconductor material capable of sufficiently reducing ON-resistance. Reduced ON-resistance is demanded of power semiconductor devices that use a wide bandgap semiconductor material and in vertical metal oxide semiconductor field effect transistors (MOSFETs), a trench gate structure is adopted that facilitates low ON-resistance characteristics structurally.

The trench gate structure is a MOS gate structure in which a MOS gate is embedded in a trench formed on a front surface of a semiconductor substrate. In the trench gate structure, reduced ON-resistance is possible due to a shorter cell pitch as compared to a planar gate structure in which a MOS gate is provided in a plate-like shape on the front surface of a semiconductor substrate. A conventional semiconductor device will be described taking as an example, a case in which silicon carbide (SiC) is used as the wide bandgap semiconductor material.

FIG. 12 is a cross-sectional view of a structure of the conventional semiconductor device. The conventional semiconductor device depicted in FIG. 12 is a vertical MOSFET that has a trench gate structure and is fabricated using a semiconductor substrate 110 containing silicon carbide. The semiconductor substrate 110 is an epitaxial substrate in which silicon carbide layers constituting an n$^-$-type drift region 102 and a p-type base region 104 are sequentially formed by epitaxial growth on an n$^+$-type starting substrate 101 containing silicon carbide.

In an n-type current diffusion region 103, first and second p$^+$-type regions 121, 122 are selectively provided separated from each other; the first and second p$^+$-type regions 121, 122 reach positions that are closer to a drain, i.e., deeper from a front surface of the semiconductor substrate 110, than is a bottom of a trench 107. The first p$^+$-type region 121 covers the bottom of the trench 107. The second p$^+$-type region 122 is selectively provided between adjacent trenches 107 (in a mesa region) so as to be in contact with the p-type base region 104 and to be separated from the trenches 107.

In the conventional semiconductor device, the p-type base region 104 has a thickness t101 that is thin, whereby reduction of the ON-resistance is realized. Further, disposal of the first and second pt-type regions 121, 122 realizes suppression of the electric field that is applied to a gate insulating film 108 during an ON-state, thereby improving the breakdown voltage (withstand voltage). Reference numerals 106, 109, 111, 112, and 113 are a p$^{++}$-type contact region, a gate electrode, an interlayer insulating film, a source electrode, and a drain electrode, respectively.

As a consequence of reducing the thickness t101 (=channel length L) of the p-type base region 104, the channel is shortened, whereby decreases in the breakdown voltage occur due to punch-through of an n$^+$-type source region 105 and the n$^-$-type drift region 102 when the MOSFET is in an OFF-state. As a first method of solving this problem, there is a method of increasing an impurity concentration of the p-type base region 104, and suppressing spreading of a depletion layer that spreads in the p-type base region 104 from both a source side and a drain side when the MOSFET is in the OFF-state.

As a second method of solving the above problem, there is a method of reducing a distance A' between the first and second pt-type regions 121, 122, and reducing a voltage of a part of the p-type base region 104 toward the n$^-$-type drift region 102. As a third method of solving the above problem, there is a method of reducing a distance B' from the trench 107 to the second p$^+$-type region 122, and suppressing spreading of a depletion layer that spreads in the n-type current diffusion region 103 from a pn junction with the p-type base region 104 when the MOSFET is in the OFF-state.

As a trench gate MOSFET that suppresses punch-through due to short channel effects, a device has been proposed in which a p-type channel layer that determines channel length has a thickness that is sufficiently thinner than a thickness of a p-type base layer that sustains an OFF-state breakdown voltage of the device and that is greater than a sum of a width of a depletion layer formed between an n-type drift layer and the p-type channel layer and a width of a depletion layer formed between an n-type source layer and the p-type channel layer, for example, refer to Japanese Laid-Open Patent Publication No. 2008-147232 (paragraphs 0032 and 0034, and FIG. 1).

Further, as a trench gate MOSFET that suppresses short channel effects and punch-through, the following device has been proposed. In the device, in a p-type base region, a region containing a p-type impurity at a high impurity concentration is provided separated from a gate insulating film (gate trench), whereby short channel effects are suppressed. The region containing the p-type impurity at a high impurity concentration has a thickness that is set to be a predetermined thickness, whereby punch-through in a region separated from the gate insulating film is suppressed, for example, refer to Japanese Laid-Open Patent Publication No. 2015-153893 (paragraphs 0079 and 0080, and FIG. 10).

SUMMARY

According to an embodiment of the invention, a semiconductor device includes a semiconductor substrate containing a semiconductor material that has a bandgap wider than that of silicon; a first semiconductor layer of a first conductivity type provided on a front surface of the semiconductor substrate and containing the semiconductor material that has a bandgap wider than that of silicon; a second semiconductor layer of a second conductivity type provided on a first side of the first semiconductor layer, opposite a second side of the first semiconductor layer facing toward the semiconductor substrate, the second semiconductor layer containing the semiconductor material that has a bandgap wider than that of silicon; a trench that penetrates the second semiconductor layer in a depth direction and reaches the first semiconductor layer; a gate electrode provided in the trench, on a gate insulating film; a first second-conductivity-type semiconductor region of the second conductivity type selectively provided in the first semiconductor layer, separated from the second semiconductor layer and beneath a bottom of the trench; a second second-conductivity-type semiconductor region of the second conductivity type selectively provided in the first semiconductor layer, between the trench and an adjacent trench, the second second-conductivity-type semiconductor region being in contact with the second semiconductor layer and separated from the first second-conductivity-type semiconductor region; a first first-conductivity-type semiconductor region of the first conductivity type selectively provided in the second semiconductor layer and opposing the gate electrode across the gate insulating film, at a side wall of the trench; a third second-conductivity-type semiconductor region of the second conductivity type selectively provided in the second semiconductor layer, the third second-conductivity-type semiconductor region being in contact with the first first-conductivity-type semiconductor region and opposing the second second-conductivity-type semiconductor region in the depth direction; a fourth second-conductivity-type semiconductor region that is of the second conductivity type and a part of the second semiconductor layer exclusive of the first first-conductivity-type semiconductor region and the third second-conductivity-type semiconductor region; a fifth second-conductivity-type semiconductor region of the second conductivity type selectively provided in the second semiconductor layer, closer to a first side of the second semiconductor layer facing toward the first semiconductor layer than a second side of the second semiconductor layer opposite the first side of the second semiconductor layer, the fifth second-conductivity-type semiconductor region being in contact with the first first-conductivity-type semiconductor region and separated from the side wall of the trench and the first semiconductor layer, the fifth second-conductivity-type semiconductor region having an impurity concentration that is higher than that of the second semiconductor layer; a first electrode in contact with the first first-conductivity-type semiconductor region and the third second-conductivity-type semiconductor region; and a second electrode provided at a rear surface of the semiconductor substrate.

In the embodiment, a first distance that is a shorter distance of a first shortest distance from the fifth second-conductivity-type semiconductor region to the second second-conductivity-type semiconductor region and a second shortest distance from the fifth second-conductivity-type semiconductor region to the third second-conductivity-type semiconductor region is at most a second distance between the first second-conductivity-type semiconductor region and the second second-conductivity-type semiconductor region.

In the embodiment, a first distance that is a shorter distance of a first shortest distance from the fifth second-conductivity-type semiconductor region to the third second-conductivity-type semiconductor region and a second shortest distance from the fifth second-conductivity-type semiconductor region to the third second-conductivity-type semiconductor region is at least 0.7 times a second distance between the first second-conductivity-type semiconductor region and the second second-conductivity-type semiconductor region.

In the embodiment, the fourth second-conductivity-type semiconductor region has an impurity concentration that is in a range from $8\times10^{16}/cm^3$ to $1.3\times10^{17}/cm^3$.

In the embodiment, the semiconductor device further includes a sixth second-conductivity-type semiconductor region selectively provided in the second semiconductor layer and in contact with the first first-conductivity-type semiconductor region, the third second-conductivity-type semiconductor region and the fifth second-conductivity-type semiconductor region, the sixth second-conductivity-type semiconductor region connecting the third second-conductivity-type semiconductor region and the fifth second-conductivity-type semiconductor region.

In the embodiment, the semiconductor device further includes a second first-conductivity-type semiconductor region provided in the first semiconductor layer, the second first-conductivity-type semiconductor region being in contact with the second semiconductor layer and reaching a position that is deeper from an interface with the second semiconductor layer and closer to the second electrode than is the bottom of the trench, the second first-conductivity-type semiconductor region having an impurity concentration that is higher than that of first semiconductor layer.

According to another embodiment of the invention, a method of manufacturing a semiconductor device that includes a gate structure in which a gate electrode is embedded in a trench, on a gate insulating film, includes forming a first semiconductor layer of a first conductivity type by epitaxial growth on a surface of a semiconductor substrate containing a semiconductor material that has a bandgap wider than that of silicon; selectively forming a first second-conductivity-type semiconductor region of a second conductivity type in the first semiconductor layer, the first second-conductivity-type semiconductor region reaching a first predetermined depth from a position that is deeper than a surface of the first semiconductor layer; selectively forming a second second-conductivity-type semiconductor region of the second conductivity type in the first semiconductor layer, the second second-conductivity-type semiconductor region being separated from the first second-conductivity-type semiconductor region and reaching a second predetermined depth from the surface of the first semiconductor layer; forming a second semiconductor layer of the second conductivity type by epitaxial growth on the surface of the first semiconductor layer, the second semiconductor layer opposing the first second-conductivity-type semiconductor region and the second second-conductivity-type semiconductor region; selectively forming a first first-conductivity-type semiconductor region of a first conductivity type in the second semiconductor layer; selectively forming a third second-conductivity-type semiconductor region of the second conductivity type in the second semiconductor layer, the third second-conductivity-type semiconductor region being in contact with the first first-conductivity-type semiconductor region, a part of the second semiconductor layer excluding the first first-conductivity-type semiconductor region and the third second-conductivity-type semiconductor region forming a fourth second-conductivity-type semiconductor region; forming the trench that penetrates the first first-conductivity-type semiconductor region and the fourth second-conductivity-type semiconductor region from a surface of the second semiconductor layer, reaches first semiconductor layer, and terminates in first second-conductivity-type semiconductor region; and ion implanting a second conductivity type impurity in a side wall of the trench at a predetermined implantation angle from a diagonal direction with respect to the surface of the second semiconductor layer, and selectively forming a fifth second-conductivity-type semiconductor region of the second conductivity type in the second semiconductor layer, the fifth secondconductivity-type semiconductor region having an impurity concentration higher than that of the second semiconductor layer. Forming the fifth second-conductivity-type semiconductor region includes forming the fifth second-conductivity-type semiconductor region in the second semiconductor layer, closer to a first side of the second semiconductor layer facing toward the first semiconductor layer than a second side of the second semiconductor layer opposite the first side of the second semiconductor layer, the fifth second-conductivity-type semiconductor region being in contact with the first first-conductivity-type semiconductor region and separated from a side wall of the trench and the first semiconductor layer.

In the embodiment, the method further includes selectively ion implanting a second conductivity type impurity from a direction orthogonal to a surface of the second semiconductor layer and selectively forming a sixth second-conductivity-type semiconductor region of the second conductivity type in the second semiconductor layer, the sixth second-conductivity-type semiconductor region connecting the third second-conductivity-type semiconductor region and the fifth second-conductivity-type semiconductor region, and having an impurity concentration higher than that of the second semiconductor layer. Forming the sixth second-conductivity-type semiconductor region includes forming the sixth second-conductivity-type semiconductor region in the second semiconductor layer, closer to the first semiconductor layer than is the first first-conductivity-type semiconductor region, the sixth second-conductivity-type semiconductor region being in contact with the first first-conductivity-type semiconductor region, the third second-conductivity-type semiconductor region and the fifth second-conductivity-type semiconductor region.

Objects, features, and advantages of the present invention are specifically set forth in or will become apparent from the following detailed description of the invention when read in conjunction with the accompanying drawings.

DESCRIPTION OF EMBODIMENTS

Figure 1:
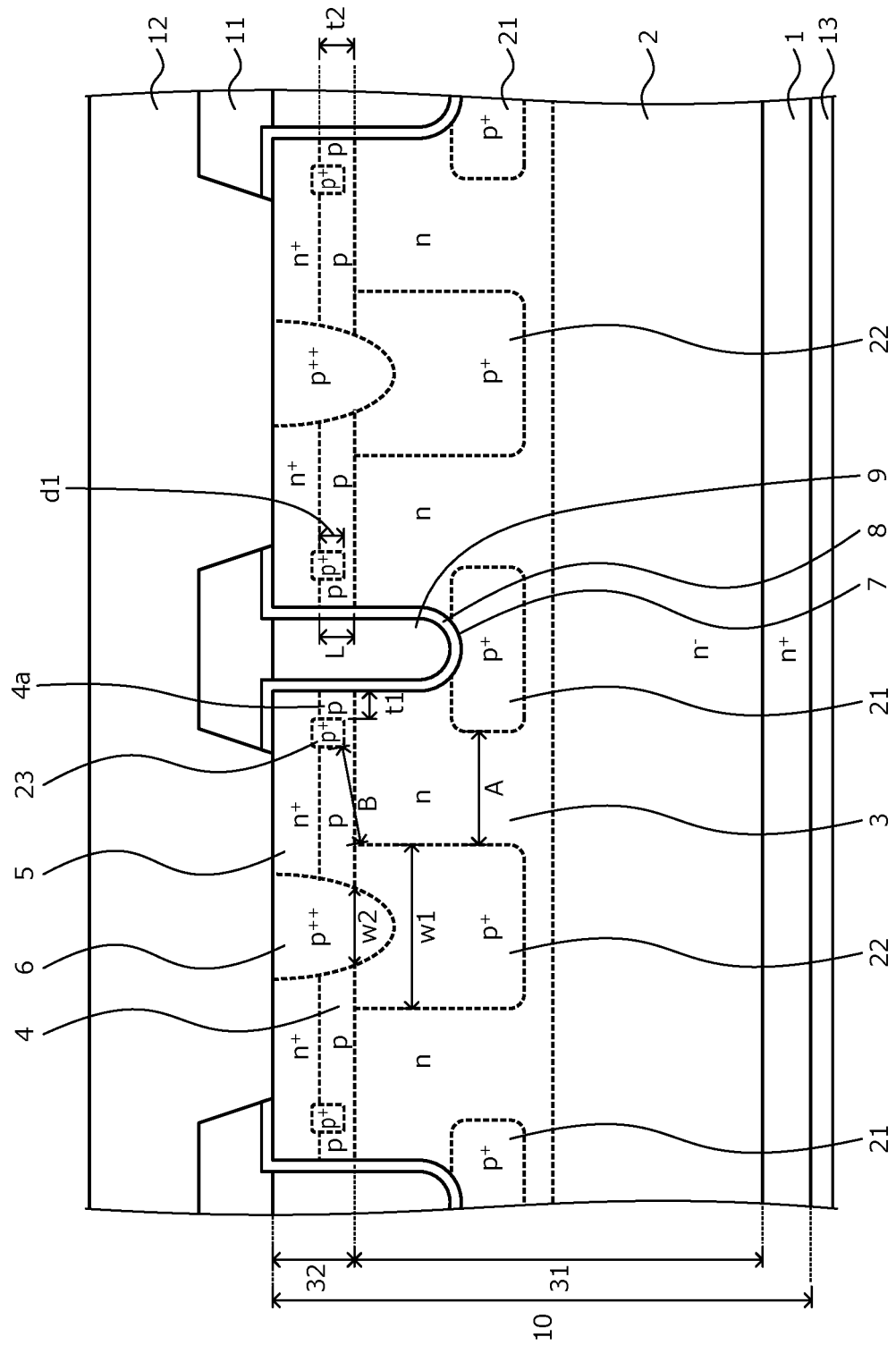
FIG. 1 is a cross-sectional view of a semiconductor device according to a first embodiment.

First, problems associated with the prior arts are discussed. In the described three methods that suppress decreases in breakdown voltage due to punch-through, the following problems newly arise. In the first method, channel mobility decreases as a consequence of increasing the impurity concentration of the p-type base region 104, whereby the ON-resistance increases. In the second method, parasitic resistance increases as a consequence of reducing the distance A' between the first and second $p^+$-type regions 121, 122, whereby the ON-resistance increases. In the third method, when the distance B' from the trench 107 to the second $p^+$-type region 122 is reduced, the cell pitch is reduced, whereby process difficulty increases.

In Japanese Laid-Open Patent Publication No. 2008-147232, punch-through between the n-type drift layer and the n-type source layer due to short channel effects is suppressed by the p-type base layer that is provided between trenches and that reaches a position that is deeper than a trench bottom from a substrate front surface. Therefore, a problem arises in that increases in ON-resistance due to increases in parasitic JFET resistance between deep p-type base layers or increases in electric field applied to an oxide film at the trench bottom may lead to decreases in reliability. In Japanese Laid-Open Patent Publication No. 2015-153893, silicon (Si) is used in one of the layers of a pn junction between a p-type body layer and the $n^-$-type drift layer and therefore, a problem arises in that breakdown voltage decreases due to decreases in avalanche electric field.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
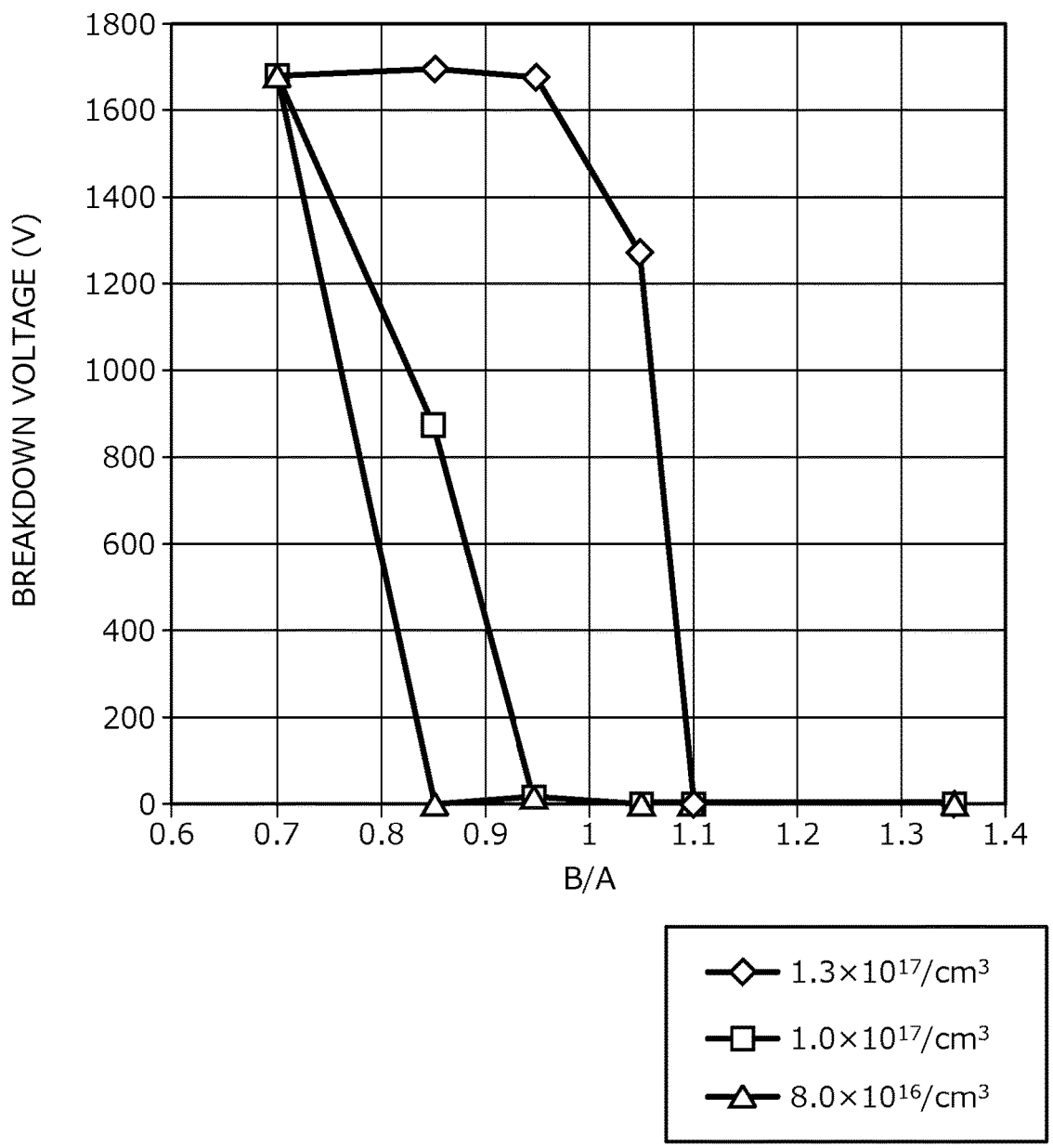
FIG. 2 depicts simulation results indicating breakdown voltage characteristics of the semiconductor device according to the first embodiment.

A semiconductor device according to a first embodiment is made using a semiconductor material (wide bandgap semiconductor material) that has a bandgap wider than that of silicon. A structure of the semiconductor device according to the first embodiment will be described taking, as an example, a case in which silicon carbide (SiC) is used as the wide bandgap semiconductor material. FIG. 1 is a cross-sectional view of the semiconductor device according to the first embodiment. FIG. 2 depicts simulation results indicating breakdown voltage characteristics of the semiconductor device according to the first embodiment. The breakdown voltage is a voltage limit that does not cause errant operation or malfunction of the semiconductor device. FIG. 1 depicts one unit cell (element configuration unit) and half of each unit cell adjacent to the one unit cell.

Further, in FIG. 1, only some of the unit cells disposed in an active region are depicted and an edge termination region that surrounds a periphery of the active region is not depicted (similarly in FIGS. 3, 4, 5, 6, 7, 8, 9, and 10. The active region is a region in which current flows when the semiconductor device is in the ON state. The edge termination region is a region between the active region and a chip (semiconductor substrate 10) side surface, and is a region that mitigates electric field at a substrate front surface (front surface of the semiconductor substrate 10) side of an $n^-$-type drift region 2 and that sustains a breakdown voltage (withstand voltage). In the edge termination region, for example, a breakdown voltage structure such as a field plate, RESURF, or a p-type region constituting a junction termination extension (JTE) structure, or a guard ring is disposed.

The semiconductor device according to the first embodiment and depicted in FIG. 1 is a vertical MOSFET that includes at a front surface side (side including a p-type base region 4) of the semiconductor substrate 10 that contains silicon carbide, a MOS gate having a trench gate structure. The semiconductor substrate 10 is an epitaxial substrate (semiconductor chip) in which silicon carbide layers (first and second semiconductor layers) 31, 32 constituting the $n^-$-type drift region 2 and the p-type base region 4 are sequentially formed by epitaxial growth on an $n^+$-type starting substrate 1 that contains silicon carbide. The MOS gate is configured by a p-type base region (fourth second-conductivity-type semiconductor region) 4, an $n^+$-type source region (first first-conductivity-type semiconductor region) 5, a $p^{++}$-type contact region (third second-conductivity-type semiconductor region) 6, a trench 7, a gate insulating film 8, and a gate electrode 9.

In particular, the trench 7 penetrates a p-type silicon carbide layer 32 (the p-type base region 4) in a depth direction from the front surface of the semiconductor substrate 10 (surface of the p-type silicon carbide layer 32) and reaches an $n^-$-type silicon carbide layer 31. The depth direction is a direction from the front surface of the semiconductor substrate 10 toward a rear surface. In the trench 7, along an inner wall of the trench 7, the gate insulating film 8 is provided. The gate electrode 9 is provided on the gate insulating film 8 so as to be embedded in the trench 7, whereby the MOS gate is configured. One unit cell is configured by one MOS gate in the trench 7 and adjacent mesa regions (regions between adjacent trenches 7) sandwiching the MOS gate.

In a surface layer of the $n^-$-type silicon carbide layer 31, on a source side (side toward a source electrode (first electrode) 12) of the $n^-$-type silicon carbide layer 31, an n-type region (hereinafter, n-type current diffusion region (second first-conductivity-type semiconductor region)) 3 is provided so as to be in contact with the p-type silicon carbide layer 32 (the p-type base region 4). The n-type current diffusion region (second first-conductivity-type semiconductor region) 3 is a so-called current spreading layer (CSL) that reduces the spreading resistance of the carrier. The n-type current diffusion region 3, for example, is provided uniformly in a direction parallel to the substrate front surface so as to be exposed at a side wall of the trench 7.

The n-type current diffusion region 3 reaches a position that is closer to a drain (drain electrode (second electrode) 13), i.e., is deeper, than is a bottom of the trench 7, from an interface with the p-type base region 4. A part of the $n^-$-type silicon carbide layer 31 other than the n-type current diffusion region 3 is the $n^-$-type drift region 2. A part of the p-type silicon carbide layer 32 other than an $n^+$-type source region 5, a $p^{++}$-type contact region 6 and a third $p^+$-type region (fifth second-conductivity-type semiconductor region) 23 described hereinafter is the p-type base region 4. In other words, the n-type current diffusion region 3 is provided between the $n^-$-type drift region 2 and the p-type base region 4, so as to be in contact with the $n^-$-type drift region 2 and the p-type base region 4.

In the n-type current diffusion region 3, first and second $p^+$-type regions (first and second second-conductivity-type semiconductor regions) 21, 22 are selectively provided. The first $p^+$-type region 21 is provided beneath the bottom of the trench 7. When the first $p^+$-type region 21 is provided to be in contact with the trench 7, the first $p^+$-type region 21 may contact the bottom and a bottom corner part of the trench 7. The bottom corner part of the trench 7 is a border of the bottom and the side wall of the trench 7. Further, the first pt-type region 21 is provided separated from the p-type base region 4, at a position closer to the drain, i.e., deeper, than is an interface of the p-type base region 4 and the n-type current diffusion region 3. The second $p^+$-type region 22 is provided between (mesa region) adjacent trenches 7, separated from the first $p^+$-type region 21 and in contact with the p-type base region 4.

Pn junctions of the n-type current diffusion region 3 (or the $n^-$-type drift region 2) and the first and second $p^+$-type regions 21, 22 may be at positions closer to the drain, i.e., deeper, than is the bottom of the trench 7 and depth positions of ends of the first and second $p^+$-type regions 21, 22 facing toward the drain may be variously changed according to design conditions. For example, the ends of the first and second $p^+$-type regions 21, 22 facing toward the drain may terminate in the n-type current diffusion region 3 closer to the drain than is the bottom of the trench 7, may reach an interface of the n-type current diffusion region 3 and the $n^-$-type drift region 2, or may terminate in the $n^-$-type drift region 2.

As described, pn junctions of the n-type current diffusion region 3 (or the $n^-$-type drift region 2) and the first and second $p^+$-type regions 21, 22 are formed at positions closer to the drain, i.e., deeper, than is the bottom of the trench 7, whereby at a part along the bottom of the trench 7, an application of high electric field to the gate insulating film 8 may be prevented. A width w1 of the second $p^+$-type region 22 at the interface of the p-type base region 4 and the n-type current diffusion region 3 may be, for example, at least a width w2 of the $p^{++}$-type contact region 6 (described hereinafter) at the interface of the p-type base region 4 and the n-type current diffusion region 3 (0.0 μm≤w2≤w1).

In the p-type silicon carbide layer 32, the $n^+$-type source region 5 and the $p^{++}$-type contact region 6 are each selectively provided so as to contact each other. The $n^+$-type source region 5 reaches the side wall of the trench 7, and faces the gate electrode 9 across the gate insulating film 8 at the side wall of the trench 7. An end of the $n^+$-type source region 5 facing toward the drain terminates in the p-type silicon carbide layer 32. The $p^{++}$-type contact region 6 faces the second $p^+$-type region 22 in the depth direction. The $p^{++}$-type contact region 6 may penetrate the p-type silicon carbide layer 32 in the depth direction from the front surface of the semiconductor substrate 10 and reach the second pt-type region 22. An end of the $p^{++}$-type contact region 6 facing toward the drain may terminate in the second $p^+$-type region 22.

Further, in the p-type silicon carbide layer 32, near the side wall of the trench 7, a third $p^+$-type region 23 is selectively provided separated from the side wall of the trench 7. The third $p^+$-type region 23 is provided, whereby when the MOSFET is in an OFF-state, spreading of a depletion layer that spreads in the n-type current diffusion region 3 from the pn junction of the p-type base region 4 and the n-type current diffusion region 3 may be suppressed. In other words, the third p$^+$-type region 23 has function of suppressing punch-through of the n$^+$-type source region 5 and the n-type current diffusion region 3 when the MOSFET is in the OFF-state. The third p$^+$-type region 23 is in contact with the n$^+$-type source region 5 and, for example, has a substantially rectangular cross-sectional shape that extends along the side wall of the trench 7. An end of the third p$^+$-type region 23 facing toward the source electrode 12 may terminate in the n$^+$-type source region 5.

An end of third p$^+$-type region 23 facing toward the drain terminates in the p-type base region 4. In other words, the end of the third p$^+$-type region 23 facing toward the drain does not reach the interface of the p-type base region 4 and the n-type current diffusion region 3. When the end of third p$^+$-type region 23 facing toward the drain reaches the interface of the p-type base region 4 and the n-type current diffusion region 3, or terminates deeper than the interface of the p-type base region 4 and the n-type current diffusion region 3, i.e., in the n-type current diffusion region 3, Junction FET (JFET) resistance increases and thus, is undesirable.

On the other hand, when a depth d1 of the third p$^+$-type region 23 is too shallow from an interface of the p-type base region 4 and the n$^+$-type source region 5, as described hereinafter, formation of the third p$^+$-type region 23 is difficult by ion implantation (hereinafter, oblique ion implantation) at the side wall of the trench 7 from an oblique direction and therefore, is not desirable. In other words, the third p$^+$-type region 23 faces the gate insulating film 8 at the side wall of the trench 7, across a part of the p-type base region 4 (or, the p-type base region 4 and the n$^+$-type source region 5) along the side wall of the trench 7.

Figure 12:
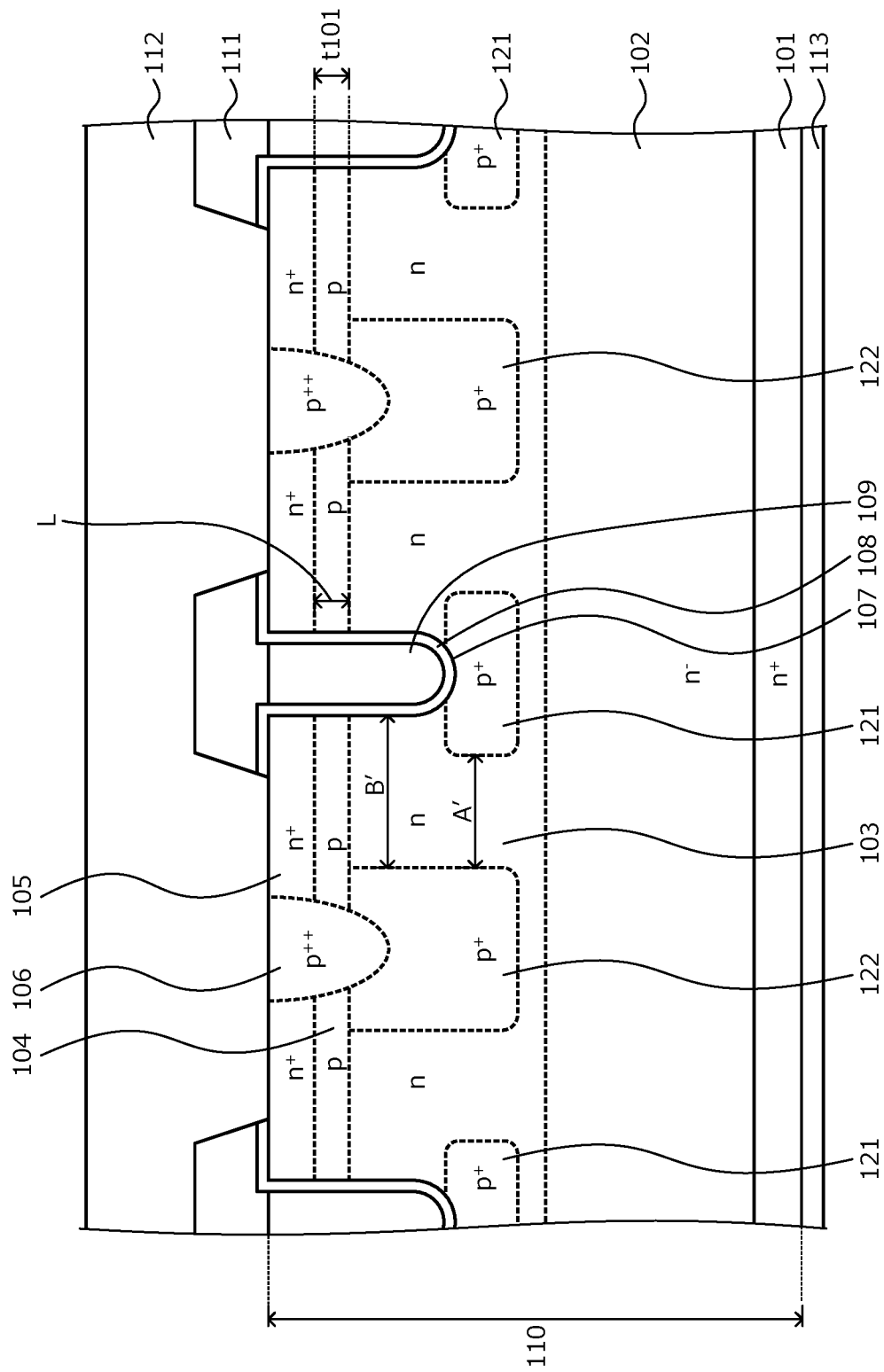
FIG. 12 is a cross-sectional view of a structure of a conventional semiconductor device.

Further, the third p$^+$-type region 23 is disposed separated from the second p$^+$-type region 22. When the MOSFET is in the OFF-state, whether the n$^+$-type source region 5 and the n-type current diffusion region 3 punch-through is determined by a shortest distance B from the third p$^+$-type region 23 to the second p$^+$-type region 22 and an impurity concentration of the p-type base region 4. In other words, when the MOSFET is in the OFF-state, the distance that determines whether the n$^+$-type source region 5 and the n-type current diffusion region 3 punch-through is not the distance B' above of the conventional structure (refer to FIG. 12), but rather the shortest distance B from the third p$^+$-type region 23 to the second p$^+$-type region 22. Therefore, reduction of the shortest distance B from the third p$^+$-type region 23 to the second p$^+$-type region 22 enables punch-through due to channel shortening to be prevented without reducing the cell pitch.

The shortest distance B from the third p$^+$-type region 23 to the second p$^+$-type region 22 is at most a distance A between the first and second p$^+$-type regions 21, 22 (B/A≤1.0). One reason for this is as follows. When the MOSFET is in the OFF-state, whether the n$^+$-type source region 5 and the n-type current diffusion region 3 punch-through is determined by the shorter of the distance A between the first and second p$^+$-type regions 21, 22 and the shortest distance B from the third p$^+$-type region 23 to the second p$^+$-type region 22. Further, when the distance A between the first and second p$^+$-type regions 21, 22 is decreased, as described, parasitic resistance increases. Therefore, the shortest distance B from the third p$^+$-type region 23 to the second p$^+$-type region 22 may be reduced. In this case, when the MOSFET is in the OFF-state, whether the n$^+$-type source region 5 and the n-type current diffusion region 3 punch-through is determined by the shortest distance B from the third p$^+$-type region 23 to the second p$^+$-type region 22.

For example, the shortest distance B from the third p$^+$-type region 23 to the second p$^+$-type region 22 may be at least 0.7 times the distance A between the first and second p$^+$-type regions 21, 22 (0.7≤B/A). One reason for this is that when the impurity concentration of the p-type base region 4 is, for example, about 8×10$^{16}$/cm$^3$ to 1.3×10$^{17}$/cm$^3$, which is set for a typical MOSFET, a high breakdown voltage of about 1600V may be realized (refer to FIG. 2). In FIG. 2, a relationship between B/A and breakdown voltage is depicted for each impurity concentration of the p-type base region 4. For example, when the impurity concentration of the p-type base region 4 is about 8×10$^{16}$/cm$^3$ to 1.0×10$^{17}$/cm$^3$, B/A=0.7 and therefore, a high breakdown voltage of about 1600V or higher may be realized. When the impurity concentration of the p-type base region 4 is about 1.3×10$^{17}$/cm$^3$, 0.7≤B/A≤1.0 and therefore, a high breakdown voltage of about 1400V or higher may be realized.

When a shortest distance from the third p$^+$-type region 23 to the p$^{++}$-type contact region 6 is shorter than the shortest distance B from third p$^+$-type region 23 to the second p$^+$-type region 22, whether the n$^+$-type source region 5 and the n-type current diffusion region 3 punch-through when the MOSFET is in the OFF-state is determined by the shortest distance from the third p$^+$-type region 23 to the p$^{++}$-type contact region 6 and the impurity concentration of the p-type base region 4.

A part of the p-type base region 4 between the side wall of the trench 7 and the third p$^+$-type region 23 is a region (hereinafter, channel region) 4a in which a channel (n-type inversion layer) is formed along the side wall of the trench 7 when the MOSFET is in an ON-state. The channel region 4a has a width that is a distance t1 from the third p$^+$-type region 23 to the side wall of the trench 7. The channel region 4a has a thickness (i.e., thickness of p-type base region) t2 that is the channel length L. Channel concentration is determined by impurity concentrations of the channel region 4a and the third p$^+$-type region 23.

The third p$^+$-type region 23 is a so-called HALO region that suppresses depletion layers that spread in the p-type base region 4, respectively, from the pn junction of the p-type base region 4 and the n$^+$-type source region 5, and the pn junction of the p-type base region 4 and the n-type current diffusion region 3, when the MOSFET is in the ON-state. Provision of the third p$^+$-type region 23 enables increases of short channel effects when the MOSFET is in the ON-state to be suppressed, even when the thickness t2 (=the channel length L) of the channel region 4a is reduced to facilitate reduction of the ON-resistance.

An interlayer insulating film 11 is provided at the substrate front surface overall so as to cover the gate electrode 9 embedded in the trench 7. All of the gate electrodes 9 are electrically connected by a gate electrode pad (not depicted) at a part not depicted. The source electrode 12 is in contact with the n$^+$-type source regions 5 and the p$^{++}$-type contact regions 6 via contact holes opened in the interlayer insulating film 11 and is electrically connected with these regions. Further, the source electrode 12 is electrically insulated from the gate electrodes 9 by the interlayer insulating film 11. At the rear surface (the rear surface of the n$^+$-type starting substrate 1 that constitutes an n$^+$-type drain region) of the semiconductor substrate 10, the drain electrode 13 is provided.

Figure 3:
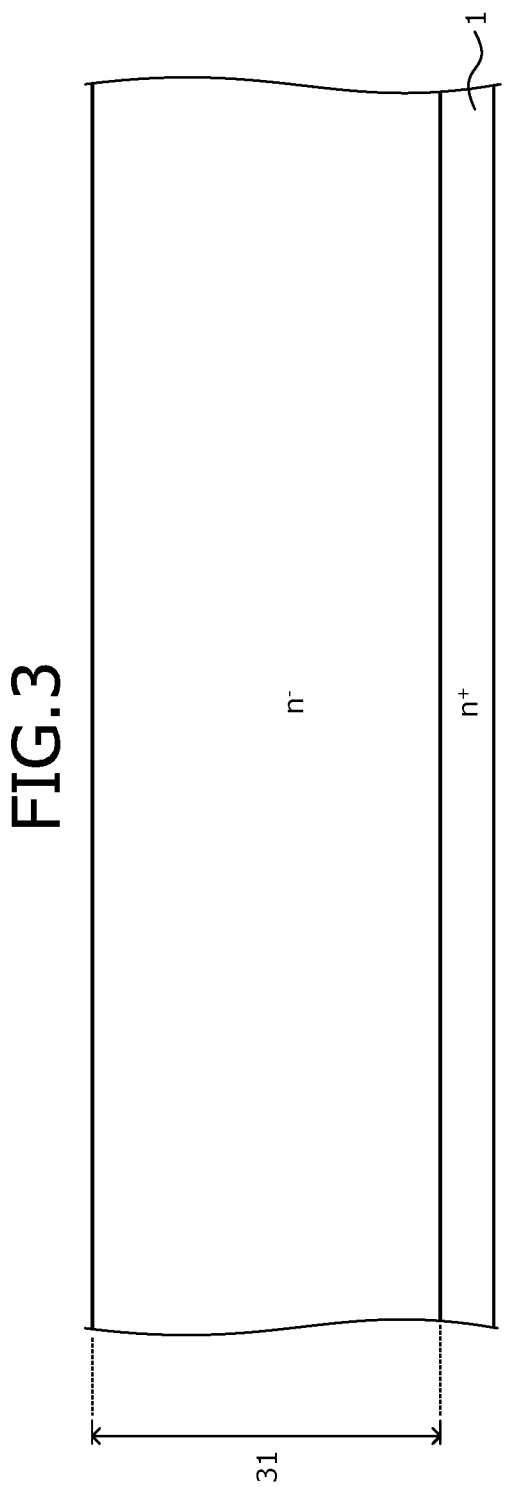
FIG. 3 is a cross-sectional view of the semiconductor device according to the first embodiment during manufacture.
Figure 4:
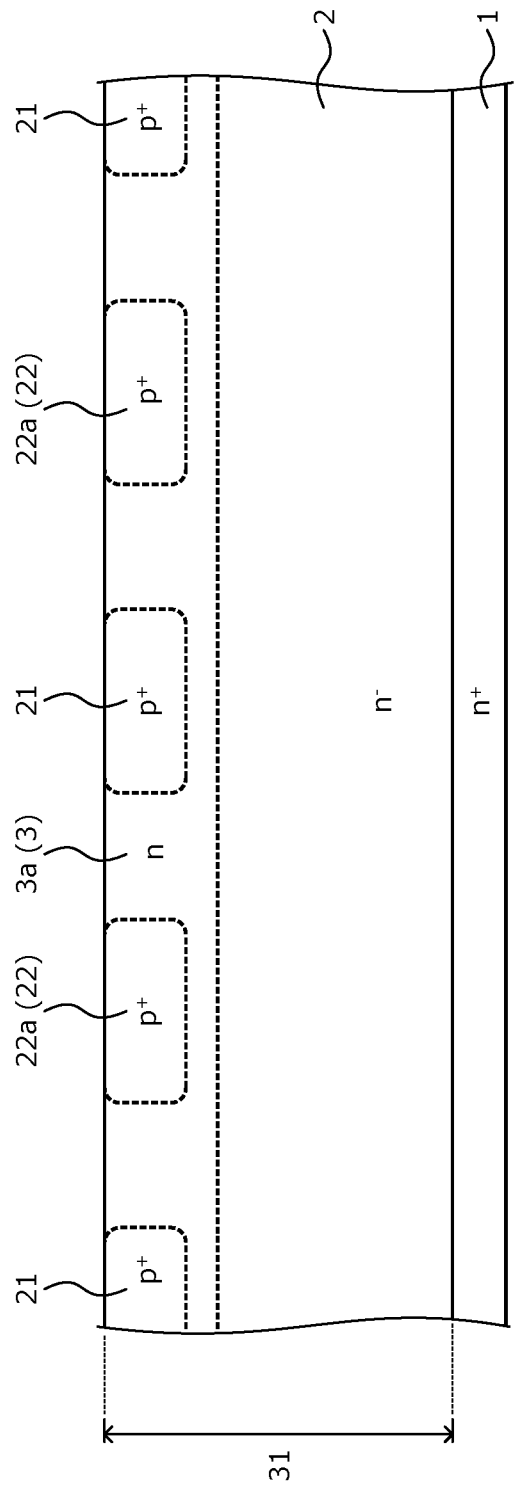
FIG. 4 is a cross-sectional view of the semiconductor device according to the first embodiment during manufacture.

A method of manufacturing a semiconductor device according to the first embodiment will be described. FIGS. 3, 4, 5, 6, 7, 8, and 9 are cross-sectional views of the semiconductor device according to the first embodiment during manufacture. First, as depicted in FIG. 3, the n$^+$-type starting substrate 1 that constitutes the n$^+$-type drain region is prepared. Next, on a front surface of the n$^+$-type starting substrate 1, the n$^-$-type silicon carbide layer 31 is formed by epitaxial growth. Next, as depicted in FIG. 4, by photolithography and ion implantation of a p-type impurity, the first p$^+$-type region 21 and a p$^+$-type region (hereinafter, p$^+$-type partial region) 22a are each selectively formed in a surface layer of the n$^-$-type silicon carbide layer 31. The p$^+$-type partial region 22a is a part of the second p$^+$-type region 22.

Next, by photolithography and ion implantation of an n-type impurity, an n-type region (hereinafter, n-type partial region) 3a is formed, for example, in the surface layer of the n$^-$-type silicon carbide layer 31 and spans the active region entirely. The n-type partial region 3a is a part of the n-type current diffusion region 3. At this time, when an end of the second p$^+$-type region 22 facing toward the drain is terminated in the n-type current diffusion region 3, a depth of the n-type partial region 3a is deeper than depths of the first p$^+$-type region 21 and the p$^+$-type partial region 22a, and respective sides of the first p$^+$-type region 21 and the p$^+$-type partial region 22a facing toward the drain (respective sides facing toward the n$^+$-type starting substrate 1) are entirely in contact with the n-type partial region 3a. A part of the n$^-$-type silicon carbide layer 31 closer to the drain than is the n-type partial region 3a constitutes the n$^-$-type drift region 2. A sequence in which the n-type partial region 3a and, the first pt-type regions 21 and the p$^+$-type partial regions 22a are formed may be interchanged.

Figure 5:
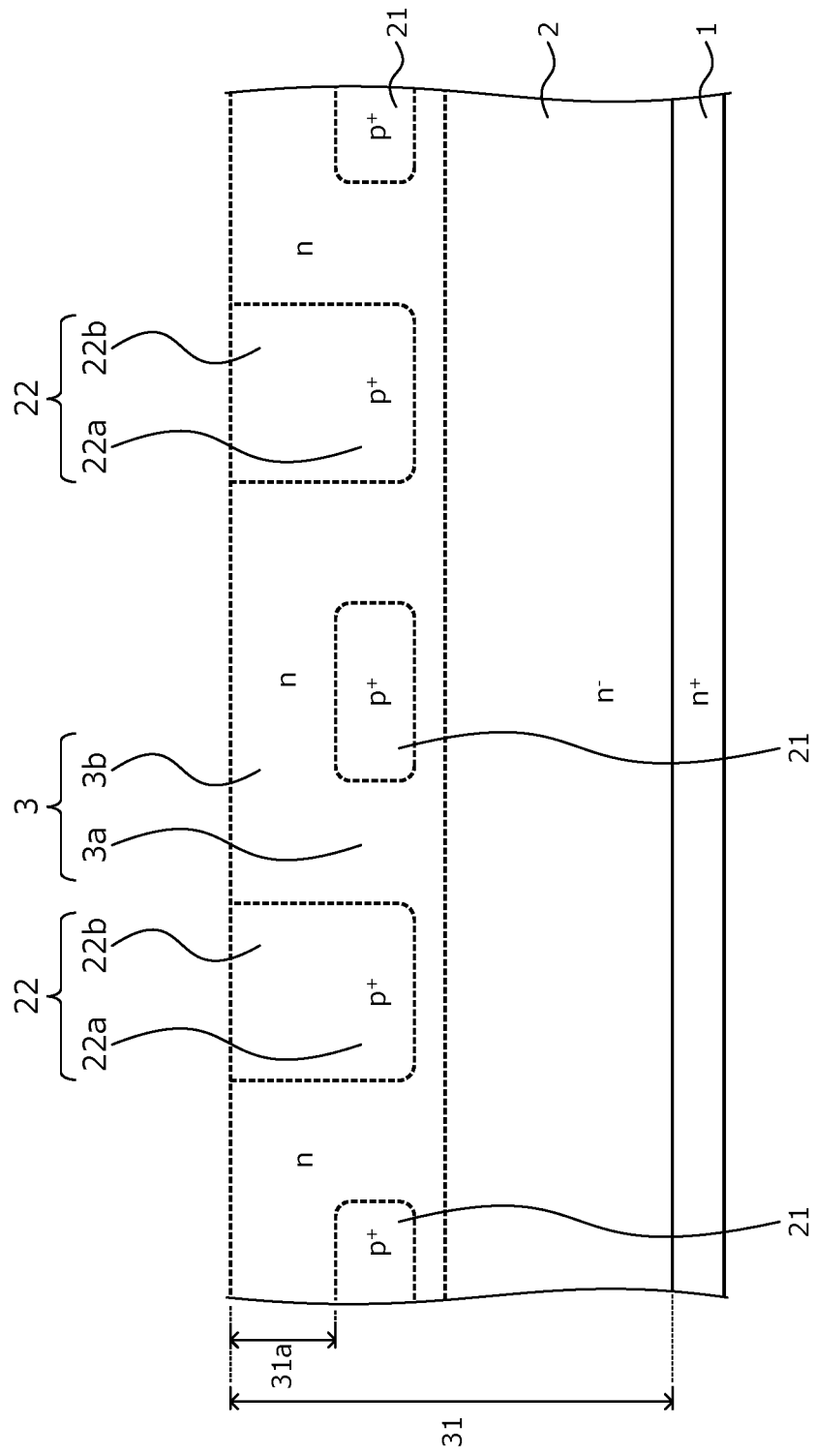
FIG. 5 is a cross-sectional view of the semiconductor device according to the first embodiment during manufacture.

Next, as depicted in FIG. 5, an n$^-$-type silicon carbide layer is further formed on the n$^-$-type silicon carbide layer 31 by epitaxial growth, whereby the thickness of the n$^-$-type silicon carbide layer 31 is increased. Next, by photolithography and ion implantation of a p-type impurity, in a part (surface layer of the n$^-$-type silicon carbide layer 31) 31a of the n$^-$-type silicon carbide layer 31 contributing to the increased thickness of the n$^-$-type silicon carbide layer 31, a p$^+$-type partial region 22b is selectively formed at regions that oppose the p$^+$-type partial regions 22a in the depth direction. The p$^+$-type partial regions 22b are formed at a depth that reaches the p$^+$-type partial regions 22a. The p$^+$-type partial regions 22b have a width and an impurity concentration that, for example, are substantially equal to those of the p$^+$-type partial regions 22a. The p$^+$-type partial regions 22a, 22b are connected in the depth direction, whereby the second p$^+$-type region 22 is formed.

Figure 6:
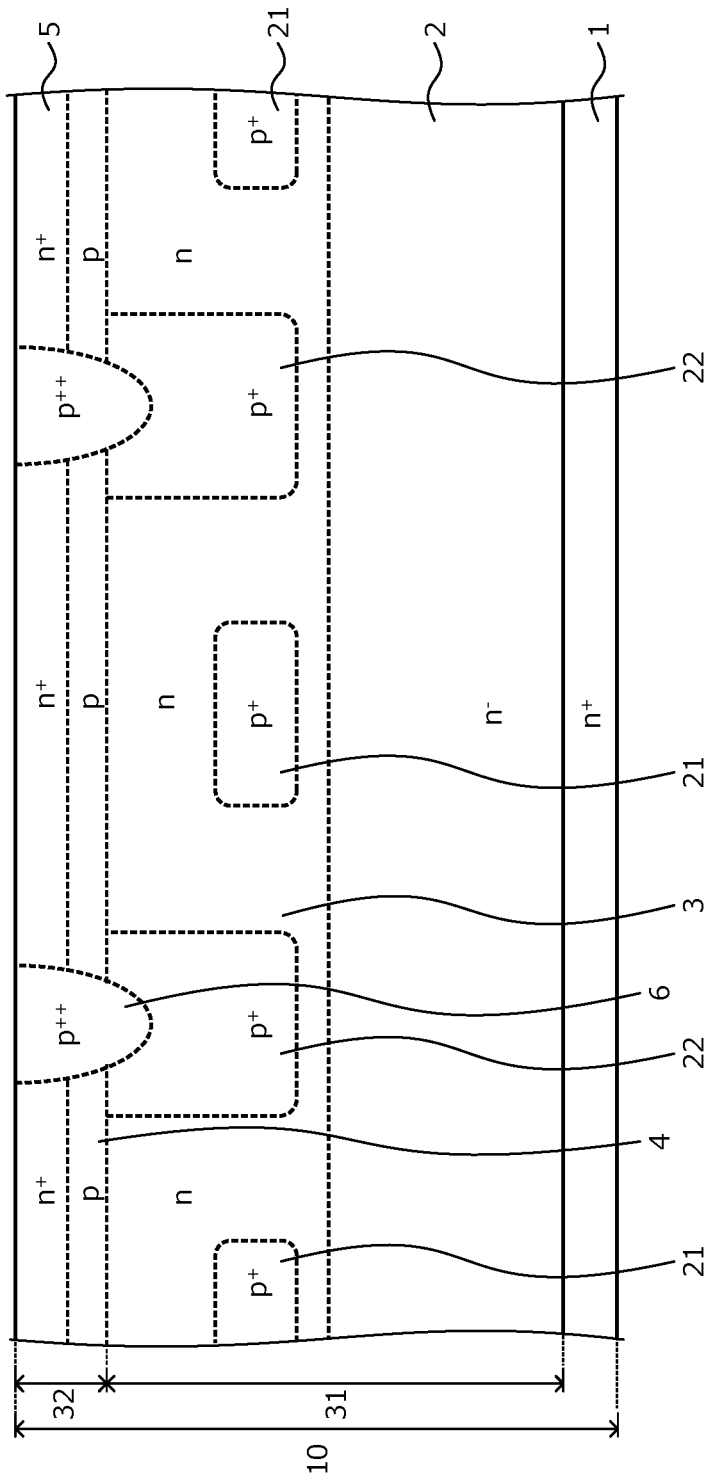
FIG. 6 is a cross-sectional view of the semiconductor device according to the first embodiment during manufacture.

Next, by photolithography and ion implantation of an n-type impurity, for example, in the entire active region, an n-type partial region 3b is formed in the part 31a contributing to the increased thickness of the n$^-$-type silicon carbide layer 31, at a depth that reaches the n-type partial region 3a. The n-type partial region 3b has an impurity concentration that is substantially equal to that of the n-type partial region 3a. The n-type partial regions 3a, 3b are connected to each other in the depth direction, whereby the n-type current diffusion region 3 is formed. A sequence in which the p$^+$-type partial region 22b and the n-type partial region 3b are formed may be interchanged. Next, as depicted in FIG. 6, the p-type silicon carbide layer 32 is formed on the n$^-$-type silicon carbide layer 31 by epitaxial growth. As a result, the semiconductor substrate (semiconductor wafer) 10 in which the n$^-$-type silicon carbide layer 31 and the p-type silicon carbide layer 32 are sequentially stacked on the n$^+$-type starting substrate 1 is formed.

Next, by photolithography and ion implantation of an n-type impurity, for example, in the entire active region, the n$^+$-type source region 5 is formed in a surface layer of the p-type silicon carbide layer 32. Next, by photolithography and ion implantation of a p-type impurity, the p$^{++}$-type contact regions 6 are selectively formed penetrating the n$^+$-type source region 5 in the depth direction and reaching the second p$^+$-type regions 22. A sequence in which the n$^+$-type source region 5 and the p$^{++}$-type contact region 6 are formed may be interchanged. Parts of the p-type silicon carbide layer 32 other than the n$^+$-type source regions 5 and the p$^{++}$-type contact regions 6 are the p-type base regions 4. In all of the ion implantations and the later-described oblique ion implantations performed in this manufacturing process, a resist film or an oxide film may be used as a mask.

Figure 7:
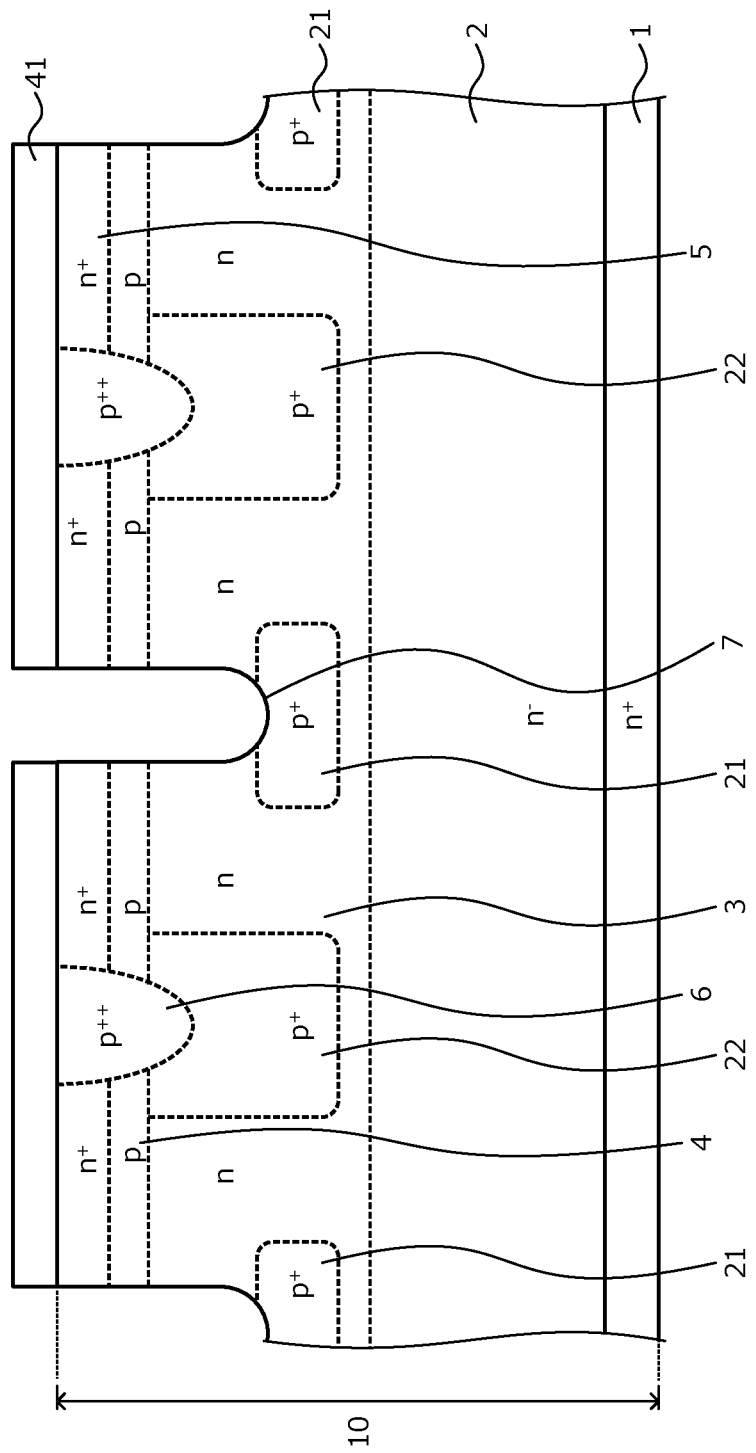
FIG. 7 is a cross-sectional view of the semiconductor device according to the first embodiment during manufacture.

Next, as depicted in FIG. 7, for example, by a thermal oxidation method or a chemical vapor deposition (CVD) method, an oxide film 41 is formed on the front surface (surfaces of the n$^+$-type source regions 5 and the p$^{++}$-type contact regions 6) of the semiconductor substrate 10. Next, by photolithography and etching, the oxide film 41 is selectively removed, whereby parts that correspond to formation regions of the trench 7 are opened. Next, etching is performed using, as a mask, the oxide film 41 that remains, and the trenches 7 are formed that penetrate the n$^+$-type source regions 5 and the p-type base regions 4, and reach the first p$^+$-type regions 21 in the n-type current diffusion region 3.

Figure 8:
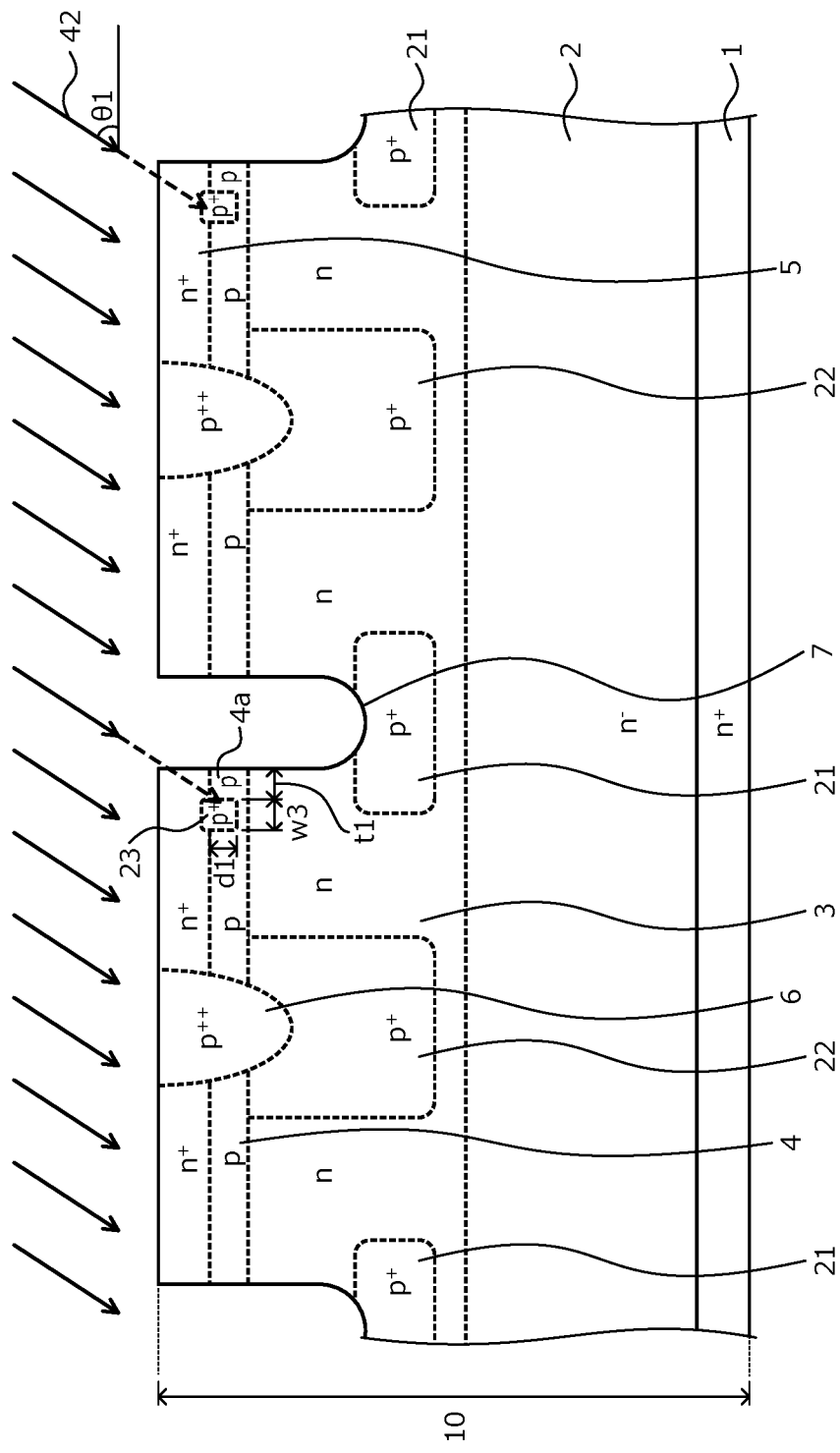
FIG. 8 is a cross-sectional view of the semiconductor device according to the first embodiment during manufacture.
Figure 9:
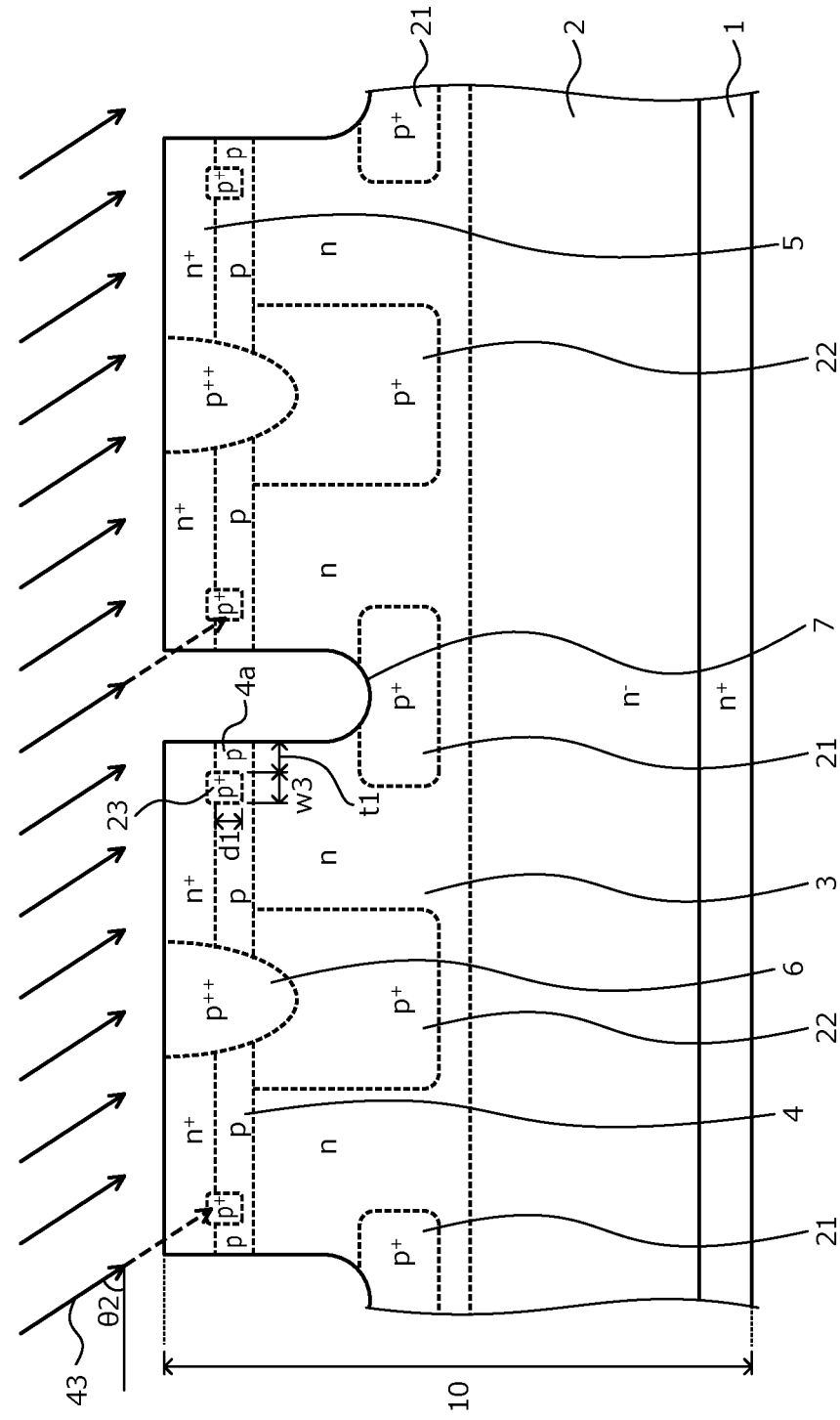
FIG. 9 is a cross-sectional view of the semiconductor device according to the first embodiment during manufacture.

Next, as depicted in FIG. 8, after the oxide film 41 is removed, from a diagonal direction at a predetermined implantation angle 81 with respect to the front surface of the semiconductor substrate 10, a p-type impurity such as aluminum (Al) is ion implanted in a first side wall of each of the trenches 7 by an ion implantation (oblique ion implantation) 42. As a result, the third p$^+$-type regions 23 are selectively formed in the p-type base regions 4, at the predetermined distance t1 from the first side wall of each of the trenches 7. Next, as depicted in FIG. 9, from a diagonal direction at a predetermined implantation angle 82 with respect to the front surface of the semiconductor substrate 10, a p-type impurity such as aluminum is ion implanted in second side wall of each of the trenches 7 by an oblique ion implantation 43. As a result, the third p$^+$-type regions 23 are selectively formed in the p-type base regions 4, at the predetermined distance t1 from the second side wall of each of the trenches 7.

In other words, by the oblique ion implantations 42, 43, a p-type impurity is implanted in both side walls of each of the trenches 7, at the implantation angles θ1, θ2 that are symmetrical with respect to the side walls of the trench 7. Other than the implantation angle 82, conditions of the oblique ion implantation 43 to the second side wall of each of the trenches 7 are similar to those of the oblique ion implantation 42 to the first side wall of each of the trenches 7. Acceleration energy and a dose amount of the oblique ion implantations 42, 43 are set based on the predetermined distance t1 from the third p$^+$-type region 23 to the side wall of the trench 7; the predetermined depth d1 of the third p$^+$-type region 23, from the interface of the p-type base region 4 and the n$^+$-type source region 5 toward the drain; and a width w3 of the third p$^+$-type region 23; and are further set so that a p-type impurity concentration near a surface of the side wall of the trench 7 in the channel region 4a, which is a passage region of the p-type impurity, becomes, for example, about $3.0 \times 10^{16}/\text{cm}^3$.

The implantation angles θ1, θ2 of the oblique ion implantations 42, 43 may be, for example, from about 30 degrees to 60 degrees with respect to the front surface of the semiconductor substrate 10. The acceleration energy of the oblique ion implantations 42, 43 may be, for example, from about 150 keV to 350 keV. In the oblique ion implantations 42, 43, while the p-type impurity is further ion implanted in the n$^+$-type source regions 5 and the p$^{++}$-type contact regions 6, the n$^+$-type source regions 5 and the p$^{++}$-type contact regions 6 have a high impurity concentration (for example, the impurity concentration of the n$^+$-type source regions 5 is about $1\times10^{19}/cm^3$), and the impurity concentration of the n$^+$-type source regions 5 and the p$^{++}$-type contact regions 6 is at least ten times the impurity concentration of the third p$^+$-type regions 23. Therefore, during the oblique ion implantations 42, 43, even when the p-type impurity is ion implanted in the n$^+$-type source regions 5 and/or the p$^{++}$-type contact regions 6, MOSFET characteristics are not adversely affected. In this manner, formation of the third p$^+$-type regions 23 by the oblique ion implantations 42, 43 enables the predetermined distance t1 from the third p$^+$-type region 23 to the side wall of the trench 7 to be stably established.

Next, along the front surface of the semiconductor substrate 10 and the inner wall of the trench 7, a non-depicted carbon (C) film is formed. Next, heat treatment (activation annealing) for activating impurities is performed for all of the regions formed by ion implantation. Next, the carbon film is removed. Next, heat treatment (annealing) for rounding corners of the bottoms of the trenches 7 and corners of openings of the trenches 7 is performed. Next, by a general method, the gate insulating films 8, the gate electrodes 9, the interlayer insulating film 11, contact holes, the source electrode 12, and the drain electrode 13 are formed. Thereafter, the semiconductor wafer is diced (cut) into individual chips, whereby the MOSFET depicted in FIG. 1 is completed.

As described, according to the first embodiment, in the p-type base region, the third p$^+$-type region is provided separated from the trench side wall, a depth of the third p$^+$-type region from the interface of the p-type base region and the n$^+$-type source region does not reach the n-type current diffusion region. As a result, whether the n$^+$-type source region and the n-type current diffusion region punch-through when the MOSFET is in the OFF-state may be determined by the shortest distance from the third p$^+$-type region to the second p$^+$-type region and the impurity concentration of the p-type base region. Therefore, by reducing the shortest distance from the third p$^+$-type region to the second p$^+$-type region, punch-through due to channel shortening may be prevented without shortening the cell pitch.

Further, according to the first embodiment, punch-through due to channel shortening may be prevented by reducing the shortest distance from the third p$^+$-type region to the second p$^+$-type region and therefore, the p-type base region may be set to have a predetermined impurity concentration and increases of the ON-resistance may be prevented. Further, according to the first embodiment, since the distance between the first and second p$^+$-type regions needs not be reduced, increases of the ON-resistance may be prevented. Further, according to the first embodiment, a depth of the third p$^+$-type region from the interface of the p-type base region and the n$^+$-type source region does not reach the n-type current diffusion region, whereby increases of the ON-resistance may be prevented.

According to the first embodiment, the third p$^+$-type region is formed in the p-type base region by oblique ion implantation to the side walls of the trenches, whereby the third p$^+$-type region may be formed by self-alignment with respect to the side wall of the trench. Therefore, the third p$^+$-type region may be formed with high positioning accuracy, at a position that is a predetermined distance from the side wall of the trench, in a direction orthogonal to the side wall of the trench.

Figure 10:
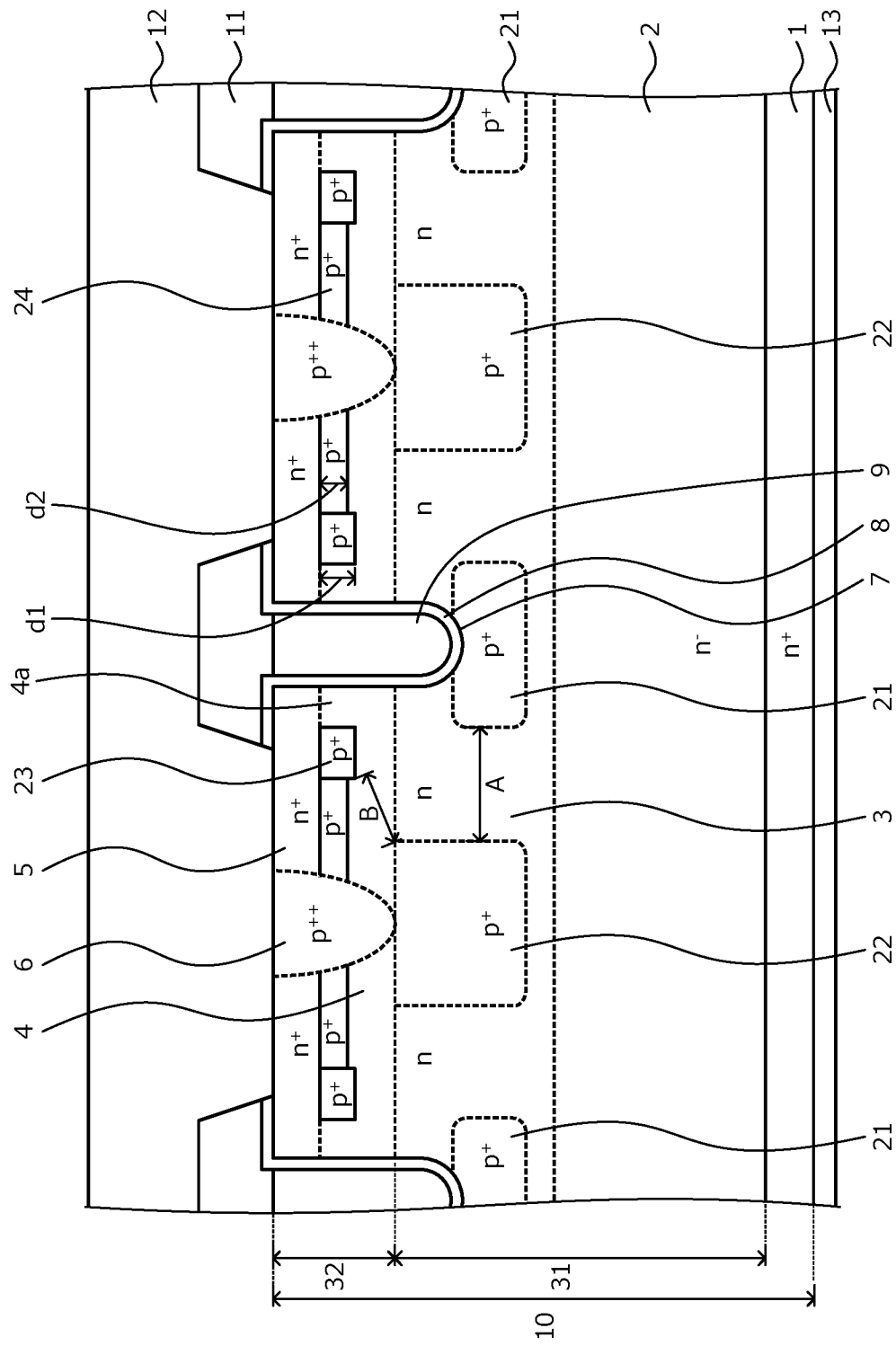
FIG. 10 is a cross-sectional view of a structure of the semiconductor device according to a second embodiment.
Figure 11:
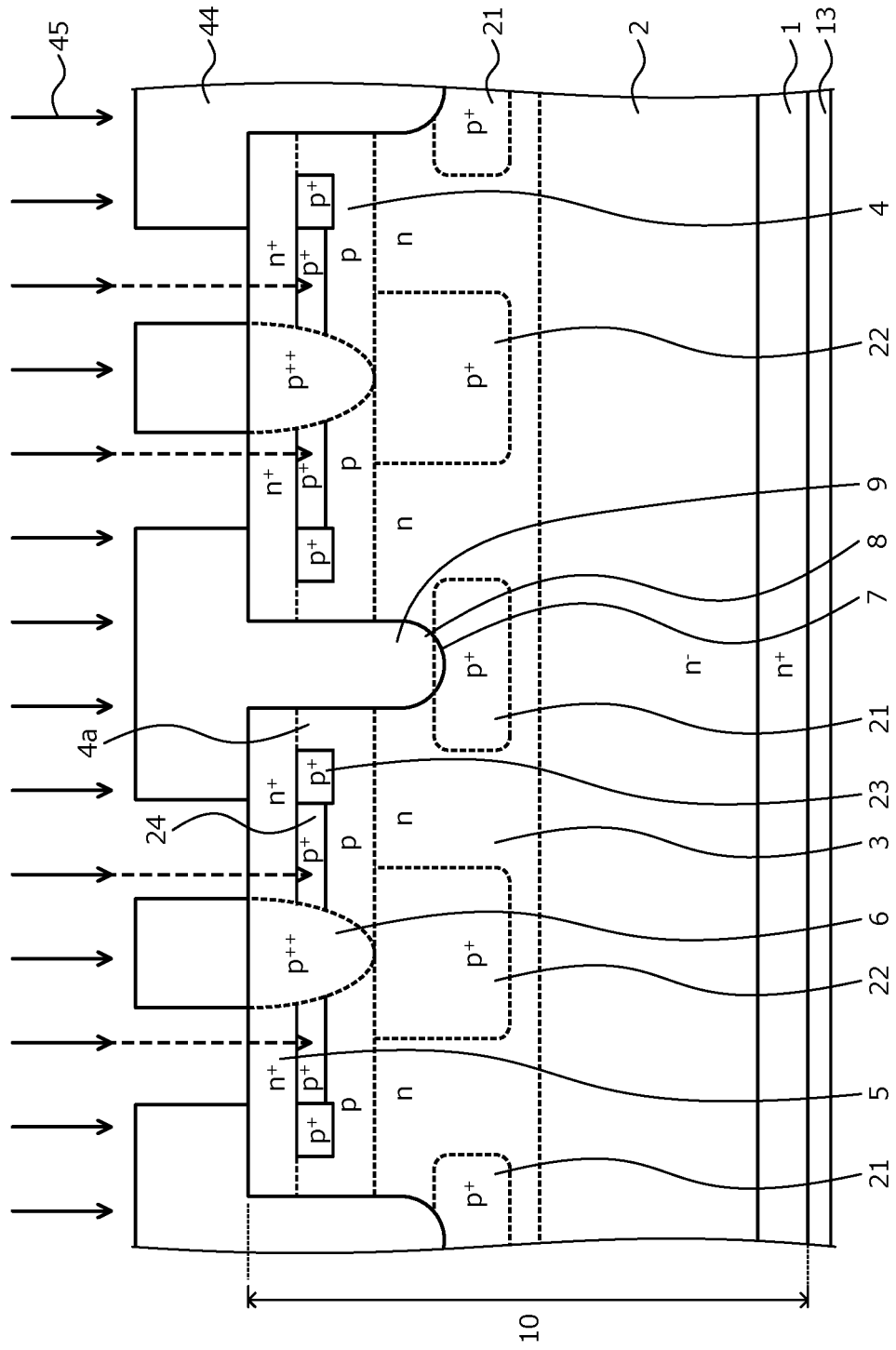
FIG. 11 is a cross-sectional view of the semiconductor device according to the second embodiment during manufacture.

A structure of the semiconductor device according to a second embodiment will be described. FIG. 10 is a cross-sectional view of the structure of the semiconductor device according to the second embodiment. FIG. 11 is a cross-sectional view of the semiconductor device according to the second embodiment during manufacture. The semiconductor device according to the second embodiment differs from the semiconductor device according to the first embodiment in that a fourth p$^+$-type region (sixth second-conductivity-type semiconductor region) 24 is provided so as to connect the third p$^+$-type region 23 and the p$^{++}$-type contact region 6.

The fourth p$^+$-type region 24 is provided in the p-type base region 4 so as to be in contact with the n$^+$-type source region 5, between the third p$^+$-type region 23 and the p$^{++}$-type contact region 6. The fourth p$^+$-type region 24 connects the third p$^+$-type region 23 and the p$^{++}$-type contact region 6. The fourth p$^+$-type region 24 has, for example, a substantially rectangular shape that extends along the interface of the p-type base region 4 and the n$^+$-type source region 5. The fourth p$^+$-type region 24 has an impurity concentration that, for example, may be equal to the impurity concentration of the third p$^+$-type region 23.

The third p$^+$-type region 23 and the p$^{++}$-type contact region 6 may be connected via the fourth p$^+$-type region 24 and a depth d2 of the fourth p$^+$-type region 24 from the interface of the p-type base region 4 and the n$^+$-type source region 5 may be variously changed according to design conditions. FIG. 10 depicts a case in which the depth d2 of the fourth p$^+$-type region 24 from the interface of the p-type base region 4 and the n$^+$-type source region 5 is shallower than the depth d1 of the third p$^+$-type region 23 from the interface of the p-type base region 4 and the n$^+$-type source region 5.

By connecting the third p$^+$-type region 23 and the p$^{++}$-type contact region 6 by the fourth p$^+$-type region 24, the shortest distance from the third p$^+$-type region 23 to the p$^{++}$-type contact region 6 becomes essentially 0 μm and is shorter than the shortest distance B from the third p$^+$-type region 23 to the second p$^+$-type region 22. Therefore, punch-through of the n$^+$-type source region 5 and the n-type current diffusion region 3 when the MOSFET is in the OFF-state may be suppressed irrespective of structural dimensions such the distance A between the first and second p$^+$-type regions 21, 22, and the shortest distance B from the third p$^+$-type region 23 to the second p$^+$-type region 22.

A method of manufacturing the semiconductor device according to the second embodiment additionally includes in the method of manufacturing the semiconductor device according to the first embodiment, an ion implantation 45 for forming the fourth p$^+$-type region 24. In particular, first, similarly to the first embodiment, the process from fabricating the semiconductor substrate (semiconductor wafer) 10 to the process of forming the third p$^+$-type regions 23 are sequentially performed (refer to FIGS. 3 to 9). Next, as depicted in FIG. 11, at the front surface of the semiconductor substrate 10 (surfaces of the n$^+$-type source region 5 and the p$^{++}$-type contact region 6), a resist film 44 that has openings corresponding to formation regions of the fourth pt-type region 24 is formed.

Next, the resist film 44 is used as a mask and the ion implantation 45 of a p-type impurity from a direction orthogonal to the front surface of the semiconductor substrate 10 is performed. As a result, at a position deeper from the front surface of the semiconductor substrate 10 than is the n$^+$-type source region 5, the fourth p$^+$-type region 24 is formed in contact with the n$^+$-type source region 5, the third p$^+$-type region 23, and the p$^{++}$-type contact region 6. A sequence in which the third p$^+$-type region 23 and the fourth p$^+$-type region 24 are formed may be interchanged. Subsequently, similarly the first embodiment, the process of forming the carbon film and subsequent processes are sequentially performed, whereby the MOSFET depicted in FIG. 10 is completed.

As described, according to the second embodiment, effects similar to those of the first embodiment may be obtained. Further, according to the second embodiment, the third p$^+$-type region and the p$^{++}$-type contact region are connected via the fourth p$^+$-type region, whereby punch-through of the n$^+$-type source region and the n-type current diffusion region when the MOSFET is in the OFF-state may be suppressed, irrespective of the arrangement and/or dimensions of the first to third p$^+$-type regions.

In the embodiments of the present invention, various modifications within a scope not departing from the spirit of the invention are possible. In the embodiments, for example, dimensions and impurity concentrations of regions may be variously set according to required specifications. Further, in the embodiments, while a case where an epitaxial substrate in which silicon carbide layers are formed on a semiconductor substrate by epitaxial growth is described as an example, regions of the semiconductor device according to the present invention may be formed on a semiconductor substrate by, for example, ion implantation, etc.

Further, in the embodiments, while a MOSFET has been described as an example, the present invention is applicable to a MOS-type semiconductor device such as an insulated gate bipolar transistor (IGBT). The present invention is further applicable to wide bandgap semiconductor materials (for example, gallium (Ga)) other than silicon carbide. The present invention is further implemented when the conductivity types (n-type, p-type) are inverted.

According to the embodiments, whether the first first-conductivity-type semiconductor region and second semiconductor layer punch-through may be determined by the shortest distance from the fifth second-conductivity-type semiconductor region to second second-conductivity-type semiconductor region and the impurity concentration of the fourth second-conductivity-type semiconductor region. Therefore, by shortening the shortest distance from the fifth second-conductivity-type semiconductor region to the second second-conductivity-type semiconductor region, punch-through due to channel shortening may be prevented without reducing the cell pitch.

The semiconductor device and the method of manufacturing a semiconductor device according to the embodiments of the invention may prevent increases of the ON-resistance and punch-through due to channel shortening.

As described, the semiconductor device and the method of manufacturing a semiconductor device according to the embodiments of the invention are useful for MOS-type semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate containing a semiconductor material that has a bandgap wider than that of silicon;
   a first semiconductor layer of a first conductivity type provided on a front surface of the semiconductor substrate and containing the semiconductor material that has a bandgap wider than that of silicon;
   a second semiconductor layer of a second conductivity type provided on a first side of the first semiconductor layer, opposite a second side of the first semiconductor layer facing toward the semiconductor substrate, the second semiconductor layer containing the semiconductor material that has a bandgap wider than that of silicon;
   a trench that penetrates the second semiconductor layer in a depth direction and reaches the first semiconductor layer;
   a gate electrode provided in the trench, on a gate insulating film;
   a first second-conductivity-type semiconductor region of the second conductivity type selectively provided in the first semiconductor layer, separated from the second semiconductor layer and beneath a bottom of the trench;
   a second second-conductivity-type semiconductor region of the second conductivity type selectively provided in the first semiconductor layer, between the trench and an adjacent trench, the second second-conductivity-type semiconductor region being in contact with the second semiconductor layer and separated from the first second-conductivity-type semiconductor region;
   a first first-conductivity-type semiconductor region of the first conductivity type selectively provided in the second semiconductor layer and opposing the gate electrode across the gate insulating film, at a side wall of the trench;
   a third second-conductivity-type semiconductor region of the second conductivity type selectively provided in the second semiconductor layer, the third second-conductivity-type semiconductor region being in contact with the first first-conductivity-type semiconductor region and opposing the second second-conductivity-type semiconductor region in the depth direction;
   a fourth second-conductivity-type semiconductor region that is of the second conductivity type and a part of the second semiconductor layer exclusive of the first first-conductivity-type semiconductor region and the third second-conductivity-type semiconductor region;
   a fifth second-conductivity-type semiconductor region of the second conductivity type selectively provided in the second semiconductor layer, closer to a first side of the second semiconductor layer facing toward the first semiconductor layer than a second side of the second semiconductor layer opposite the first side of the second semiconductor layer, the fifth second-conductivity-type semiconductor region being in contact with the first first-conductivity-type semiconductor region and separated from the side wall of the trench and the first semiconductor layer, the fifth second-conductivity-type semiconductor region having an impurity concentration that is higher than that of the second semiconductor layer;

a first electrode in contact with the first first-conductivity-type semiconductor region and the third second-conductivity-type semiconductor region; and a second electrode provided at a rear surface of the semiconductor substrate.

2. The semiconductor device according to claim 1, wherein a first distance that is a shorter distance of a first shortest distance from the fifth second-conductivity-type semiconductor region to the second second-conductivity-type semiconductor region and a second shortest distance from the fifth second-conductivity-type semiconductor region to the third second-conductivity-type semiconductor region is at most a second distance between the first second-conductivity-type semiconductor region and the second second-conductivity-type semiconductor region.

3. The semiconductor device according to claim 1, wherein a first distance that is a shorter distance of a first shortest distance from the fifth second-conductivity-type semiconductor region to the third second-conductivity-type semiconductor region and a second shortest distance from the fifth second-conductivity-type semiconductor region to the third second-conductivity-type semiconductor region is at least 0.7 times a second distance between the first second-conductivity-type semiconductor region and the second second-conductivity-type semiconductor region.

4. The semiconductor device according to claim 1, wherein the fourth second-conductivity-type semiconductor region has an impurity concentration that is in a range from $8 \times 10^{16}/cm^3$ to $1.3 \times 10^{17}/cm^3$.

5. The semiconductor device according to claim 1, further comprising a sixth second-conductivity-type semiconductor region selectively provided in the second semiconductor layer and in contact with the first first-conductivity-type semiconductor region, the third second-conductivity-type semiconductor region and the fifth second-conductivity-type semiconductor region, the sixth second-conductivity-type semiconductor region connecting the third second-conductivity-type semiconductor region and the fifth second-conductivity-type semiconductor region.

6. The semiconductor device according to claim 1, further comprising a second first-conductivity-type semiconductor region provided in the first semiconductor layer, the second first-conductivity-type semiconductor region being in contact with the second semiconductor layer and reaching a position that is deeper from an interface with the second semiconductor layer and closer to the second electrode than is the bottom of the trench, the second first-conductivity-type semiconductor region having an impurity concentration that is higher than that of first semiconductor layer.

7. A method of manufacturing a semiconductor device that includes a gate structure in which a gate electrode is embedded in a trench, on a gate insulating film, the method comprising:

forming a first semiconductor layer of a first conductivity type by epitaxial growth on a surface of a semiconductor substrate containing a semiconductor material that has a bandgap wider than that of silicon;

selectively forming a first second-conductivity-type semiconductor region of a second conductivity type in the first semiconductor layer, the first second-conductivity-type semiconductor region reaching a first predetermined depth from a position that is deeper than a surface of the first semiconductor layer;

selectively forming a second second-conductivity-type semiconductor region of the second conductivity type in the first semiconductor layer, the second second-conductivity-type semiconductor region being separated from the first second-conductivity-type semiconductor region and reaching a second predetermined depth from the surface of the first semiconductor layer;

forming a second semiconductor layer of the second conductivity type by epitaxial growth on the surface of the first semiconductor layer, the second semiconductor layer opposing the first second-conductivity-type semiconductor region and the second second-conductivity-type semiconductor region;

selectively forming a first first-conductivity-type semiconductor region of a first conductivity type in the second semiconductor layer;

selectively forming a third second-conductivity-type semiconductor region of the second conductivity type in the second semiconductor layer, the third second-conductivity-type semiconductor region being in contact with the first first-conductivity-type semiconductor region, a part of the second semiconductor layer excluding the first first-conductivity-type semiconductor region and the third second-conductivity-type semiconductor region forming a fourth second-conductivity-type semiconductor region;

forming the trench that penetrates the first first-conductivity-type semiconductor region and the fourth second-conductivity-type semiconductor region from a surface of the second semiconductor layer, reaches first semiconductor layer, and terminates in first second-conductivity-type semiconductor region; and ion implanting a second conductivity type impurity in a side wall of the trench at a predetermined implantation angle from a diagonal direction with respect to the surface of the second semiconductor layer, and selectively forming a fifth second-conductivity-type semiconductor region of the second conductivity type in the second semiconductor layer, the fifth second-conductivity-type semiconductor region having an impurity concentration higher than that of the second semiconductor layer, wherein forming the fifth second-conductivity-type semiconductor region includes forming the fifth second-conductivity-type semiconductor region in the second semiconductor layer, closer to a first side of the second semiconductor layer facing toward the first semiconductor layer than a second side of the second semiconductor layer opposite the first side of the second semiconductor layer, the fifth second-conductivity-type semiconductor region being in contact with the first first-conductivity-type semiconductor region and separated from a side wall of the trench and the first semiconductor layer.

8. The method according to claim 7, further comprising selectively ion implanting a second conductivity type impurity from a direction orthogonal to a surface of the second semiconductor layer and selectively forming a sixth second-conductivity-type semiconductor region of the second conductivity type in the second semiconductor layer, the sixth second-conductivity-type semiconductor region connecting the third second-conductivity-type semiconductor region and the fifth second-conductivity-type semiconductor region, and having an impurity concentration higher than that of the second semiconductor layer, wherein forming the sixth second-conductivity-type semiconductor region includes forming the sixth second-conductivity-type semiconductor region in the second semiconductor layer, closer to the first semiconductor layer than is the first first-conductivity-type semiconductor region, the sixth second-conductivity-type semiconductor region being in contact with the first first-conductivity-type semiconductor region, the third second-conductivity-type semiconductor region and the fifth second-conductivity-type semiconductor region.

\* \* \* \* \*